United States Patent
Fujii et al.

(10) Patent No.: US 11,569,809 B2
(45) Date of Patent: Jan. 31, 2023

(54) LOAD DRIVE CONTROL DEVICE

(71) Applicant: MAZDA MOTOR CORPORATION, Hiroshima (JP)

(72) Inventors: Norihisa Fujii, Hiroshima (JP); Masahito Sonehara, Hiroshima (JP)

(73) Assignee: MAZDA MOTOR CORPORATION, Hiroshima (JP)

( * ) Notice: Subject to any disclaimer, the term of this patent is extended or adjusted under 35 U.S.C. 154(b) by 0 days.

(21) Appl. No.: 17/585,018

(22) Filed: Jan. 26, 2022

(65) Prior Publication Data

US 2022/0247400 A1     Aug. 4, 2022

(30) Foreign Application Priority Data

Jan. 29, 2021 (JP) .............................. JP2021-013545

(51) Int. Cl.
*H03K 17/0412* (2006.01)
*H03K 17/16* (2006.01)

(52) U.S. Cl.
CPC ..... *H03K 17/04123* (2013.01); *H03K 17/163* (2013.01)

(58) Field of Classification Search
CPC ........................ H03K 17/04123; H03K 17/163
See application file for complete search history.

(56) References Cited

U.S. PATENT DOCUMENTS

| | | |
|---|---|---|
| 8,258,822 B2 | 9/2012 | Tumminaro et al. |
| 10,097,176 B2 | 10/2018 | Suzuki |
| 10,505,529 B1 | 12/2019 | Takao |
| 2002/0070772 A1 | 6/2002 | Neacsu et al. |
| 2015/0035584 A1 | 2/2015 | Fujita |
| 2018/0301977 A1 | 10/2018 | Yamada |

FOREIGN PATENT DOCUMENTS

| | | | |
|---|---|---|---|
| WO | 99/65144 A1 | 12/1999 | |
| WO | WO-2014132523 A1 * | 9/2014 | ............. H03K 17/08 |

* cited by examiner

*Primary Examiner* — Metasebia T Retebo
(74) *Attorney, Agent, or Firm* — Studebaker & Brackett PC

(57) ABSTRACT

A predriver circuit that controls driver elements includes a slope control circuit that separately controls inclination of slope of current from the driver elements, and inclination of slope of voltage from a driver circuit. A controller outputs, to the predriver circuit, a current control signal selected from a plurality of current control signals and a voltage control signal selected from a plurality of voltage control signals, to control the slope of current from the driver elements and the slope of voltage from the driver circuit.

12 Claims, 7 Drawing Sheets

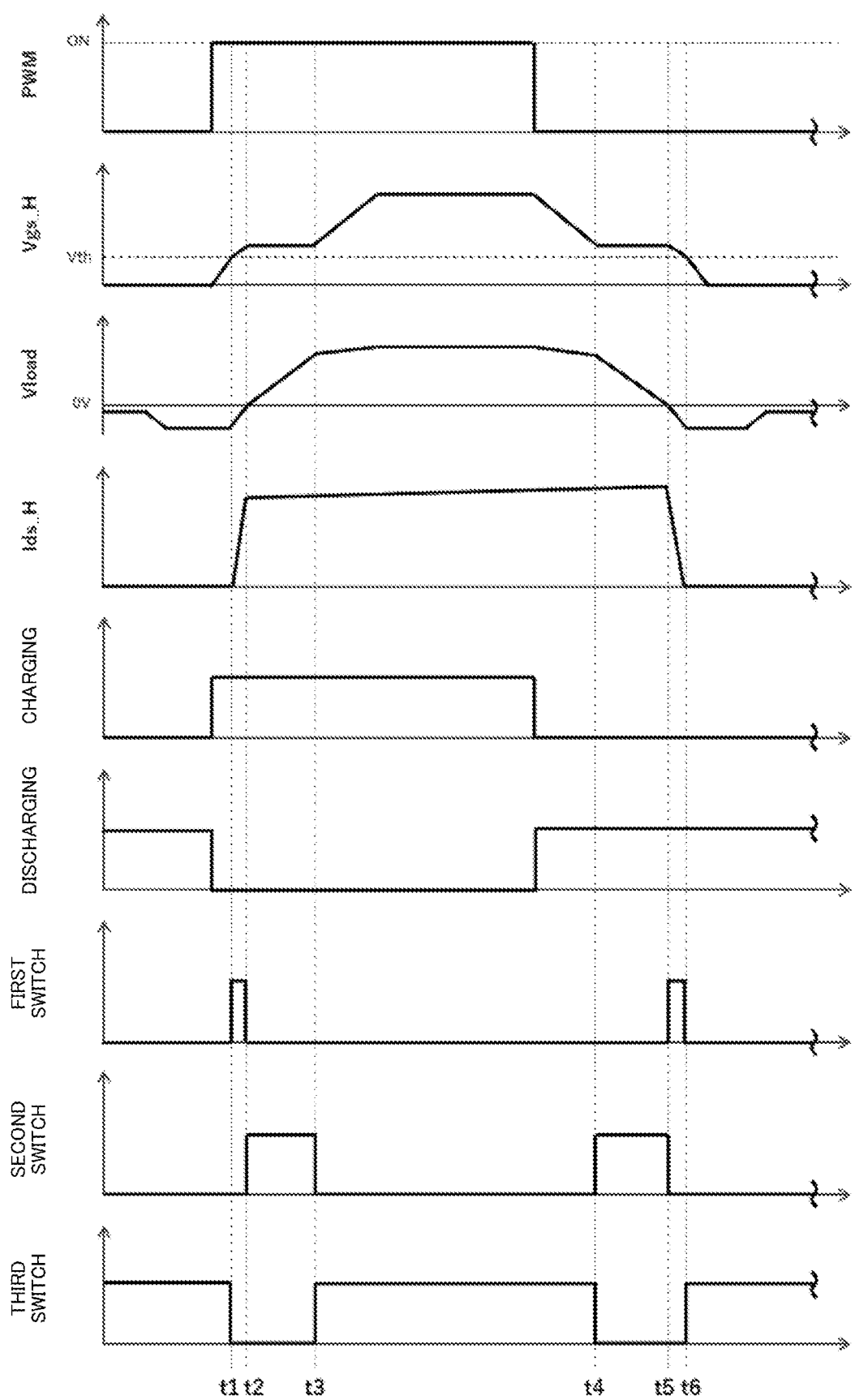

LOAD DRIVE CONTROL DEVICE

CROSS-REFERENCE TO RELATED APPLICATION

This application claims priority to Japanese Patent Application No. 2021-013545 filed on Jan. 29, 2021, the entire disclosure of which is incorporated by reference herein.

BACKGROUND

The present disclosure belongs to a technical field of a load drive control device.

A solenoid (load) mounted in a vehicle is generally driven by turning a driver transistor ON/OFF with a pulse width modulation (PWM) control. When the driver transistor is turned ON/OFF, the current and voltage for driving the solenoid need to be switched as quickly as possible in order to reduce switching loss.

However, the high switching speed causes an increase in the induced electromotive force due to a steep current change and the parasitic inductance and an increase in electro magnetic interface (EMI) noise due to high frequency components of the output voltage. Therefore, attempts have been made to reduce both the EMI noise and the switching loss as much as possible.

For example, U.S. Pat. No. 8,258,822 discloses a load drive control device that adjusts the amount of current from a current source for turning ON/OFF the driver transistor to change the inclination of the rising and falling slopes of output voltage for driving a load.

SUMMARY

For example, in a driver circuit that drives a device mounted on a vehicle, the arrangement of a wire harness connected to the driver circuit varies depending on the configuration of the body of the vehicle and the like. When the arrangement of the wire harness varies, the length of the wiring harnesses changes, thereby changing the induced electromotive force due to the parasitic inductance and the like of the wire harness. This changes the waveform of the output voltage from the device. Further, when the arrangement of the driver circuit varies depending on the configuration of the body of the vehicle and the like, the heat dissipation structure of heat generated through switching or the like varies, thereby changing the amount of heat generation allowed by the driver circuit. In order to achieve both the reduction in the EMI noise and the reduction in the switching loss, the current waveform and the voltage waveform need to be matched to be suitable for the kind of the vehicle, further for the arrangement of the driver circuit in each vehicle. In addition, enhancement of commonality of integrated circuits (ICs), where driver circuits are mounted, as much as possible is also in demand.

Further, in Patent Document 1, the inclination of rising and falling of the output voltage is changed, but the output current still needs to be considered because the switching loss is the product of the voltage applied to the driver element and the current flowing in the driver element. There is still room for improvement in reducing both EMI noise and switching loss.

The present disclosure was made in view of the problems, and it is an objective of the present disclosure to provide a load drive control device capable of achieving both the reduction in the EMI noise and the reduction in the switching loss while increasing the commonality of the configuration of the IC.

In order to achieve the objective, the technique disclosed herein is directed to a load drive control device including: a driver circuit configured to drive a load; a predriver circuit configured to drive the driver circuit; and a controller configured to output a control signal to the predriver circuit to control a driving state of the driver circuit, the driver circuit including a high-side driver element and a low-side driver element, the predriver circuit including a slope control circuit configured to separately control inclination of a current slope indicating rising and falling of an output current output from at least either one of the high-side driver element or the low-side driver element, and inclination of a voltage slope indicating rising and falling of an output voltage output from the driver circuit, the controller being configured to output, to the predriver circuit, a current control signal selected from a plurality of current control signals set for each pattern of the current slope, and a voltage control signal selected from a plurality of voltage control signals set for each pattern of the voltage slope, to control the current slope and the voltage slope.

With this configuration, the controller may select suitable patterns from the plurality of patterns of the current slope and the plurality of patterns of the voltage slope depending on the equipment where the load drive control device is mounted. The control signal indicating each pattern may be stored in a storage in the IC or may be acquired from a controller outside the IC such as a microcomputer. In this manner, the reduction in EMI noise and the reduction in switching loss can be achieved for each equipment while achieving the commonality of the configuration of the IC.

In the load drive control device, the predriver circuit includes: a high-side predriver circuit configured to drive the high-side driver element; and a low-side predriver circuit configured to drive the low-side driver element, and the slope control circuit is provided in the high-side predriver circuit, and is configured to separately control inclination of the current slope indicating rising and falling of the output current output from the high-side driver element, and inclination of the voltage slope indicating rising and falling of the output voltage output from the driver circuit.

In particular, the operation of the high-side driver element is involved in EMI noise and switching loss. Thus, the slope control circuit provided in the high-side predriver circuit to control the current slope and the voltage slope effectively achieves both the reduction in the EMI noise and the reduction in the switching loss.

The load drive control device may further include: a storage electrically connected to the controller and storing the plurality of current control signals and the plurality of voltage control signals, and the controller may be configured to read and output a desired current control signal and a desired voltage control signal from the plurality of current control signals and the plurality of voltage control signals stored in the storage to the predriver circuit.

With this configuration, the control is completed only in the driver circuit; thus, the current slope and the voltage slope can be controlled accurately.

In the load drive control device including the storage, the storage may store combinations of the plurality of current control signals and the plurality of voltage control signals in advance, and the controller may be configured to read and output a combination of the desired current control signal and the desired voltage control signal from the storage to the predriver circuit.

With this configuration, the controller only needs to select a combination of a current control signal and a voltage control signal. This allows the control of the driver circuit to be simplified.

In one aspect of the load drive control device, the controller is configured to control a current slope control period in which the current slope is controlled, and a voltage slope control period in which the voltage slope is controlled for each period of the current slope and the voltage slope so as not to overlap with each other, and further output a control signal for controlling the current slope during the current slope control period to the slope control circuit, and output a control signal for controlling the voltage slope during the voltage slope control period to the slope control circuit.

Specifically, the periods of rising and falling of the output current differ from the periods of rising and falling of the output voltage. Thus, the current slope control period and the voltage slope control period can be set not to overlap with each other. This allows separate control of the current slope and the voltage slope. Accordingly, the current slope and the voltage slope can be matched to be suitable for each equipment, and the reduction in the EMI noise and the reduction in the switching loss can be effectively achieved.

In the aspect, the controller may be configured to output a control signal to the predriver circuit so that the voltage slope control period is set to be after the current slope control period when the high-side driver element or the low-side driver element is turned ON, and the current slope control period is set to be after the voltage slope control period when the high-side driver element or the low-side driver element is turned OFF.

Specifically, if the high-side driver element and the low-side driver element are transistors, the controller may be configured to set, as the current slope control period, a period from when the high-side driver element or the low-side driver element is turned ON until current output from the high-side driver element and the low-side driver element reaches load current if the high-side driver element or the low-side driver element is turned ON, and a period after the voltage slope control period and until the high-side driver element or the low-side driver element is turned OFF if the high-side driver element or the low-side driver element is turned OFF, and set, as the voltage slope control period, a period including a mirror period in turning ON and OFF of the high-side driver element and the low-side driver element.

In other words, the current slope control period is shorter than the voltage slope control period. Thus, when the driver transistor is turned ON, the current slope is controlled before control of the voltage slope, and when the driver transistor is turned OFF, the current slope is controlled after the control of the voltage slope. This allows control of the voltage slope for as long as possible while suitably controlling the current slope. Specifically, setting, as a period of adjusting the voltage slope, a period including the mirror period allows control of the voltage slope with almost no influence on the control of the current slope. As a result, the reduction in the EMI noise and the reduction in the switching loss can be effectively achieved.

BRIEF DESCRIPTION OF THE DRAWINGS

FIG. 5 illustrates timing charts showing a relationship among the gate-to-source voltage and the drain-to-source current of the high-side transistor, and the output voltage.

DETAILED DESCRIPTION

Exemplary embodiments will be described in detail below with reference to the drawings.

First Embodiment

Figure 1:
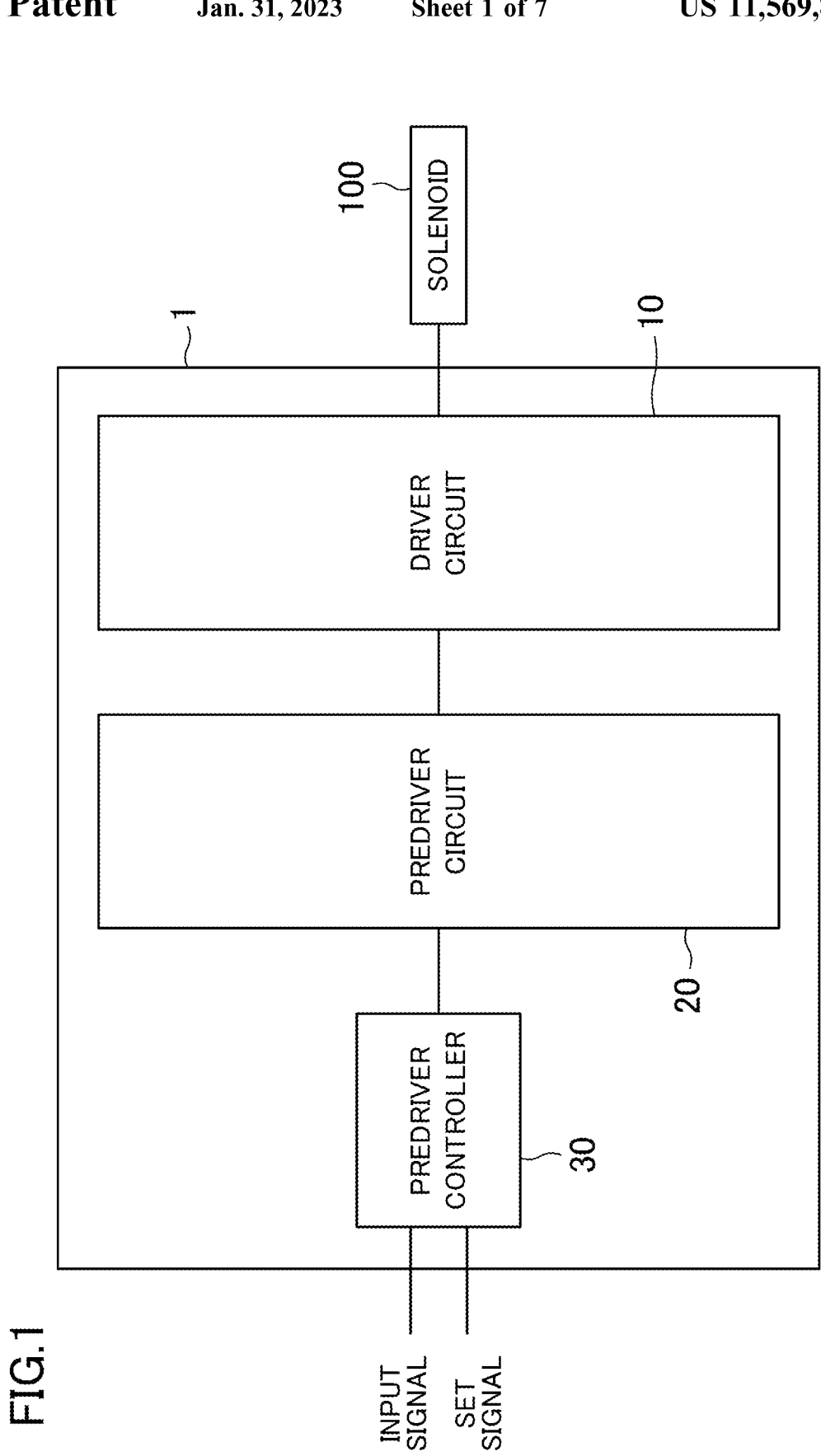
FIG. 1 is a block diagram schematically illustrating an IC constituting a load drive control device according to an exemplary first embodiment.

FIG. 1 schematically shows a configuration of a driver integrated circuit (IC) 1 as a load drive control device according to the first embodiment. The driver IC1 is mounted in a vehicle, for example. Specifically, the driver IC1 is used to electrically control a solenoid valve 100 for adjusting the hydraulic pressure in a transmission mounted in the vehicle. In this case, the solenoid valve 100 corresponds to a load to be controlled. In the following description, it is assumed that the solenoid valve 100 is a load. The load drive control device according to the first embodiment can be used to control not only the solenoid valve 100, but also other loads such as an injector and a motor.

The driver IC1 includes a driver circuit 10 configured to actually operate the solenoid valve 100, a predriver circuit 20 configured to control the operation of the driver circuit 10, and a predriver controller 30 (hereinafter referred to as a controller 30) configured to output a control signal to the predriver circuit 20. In the first embodiment, a set signal for the control of the predriver circuit 20 is input to the controller 30.

Figure 2:
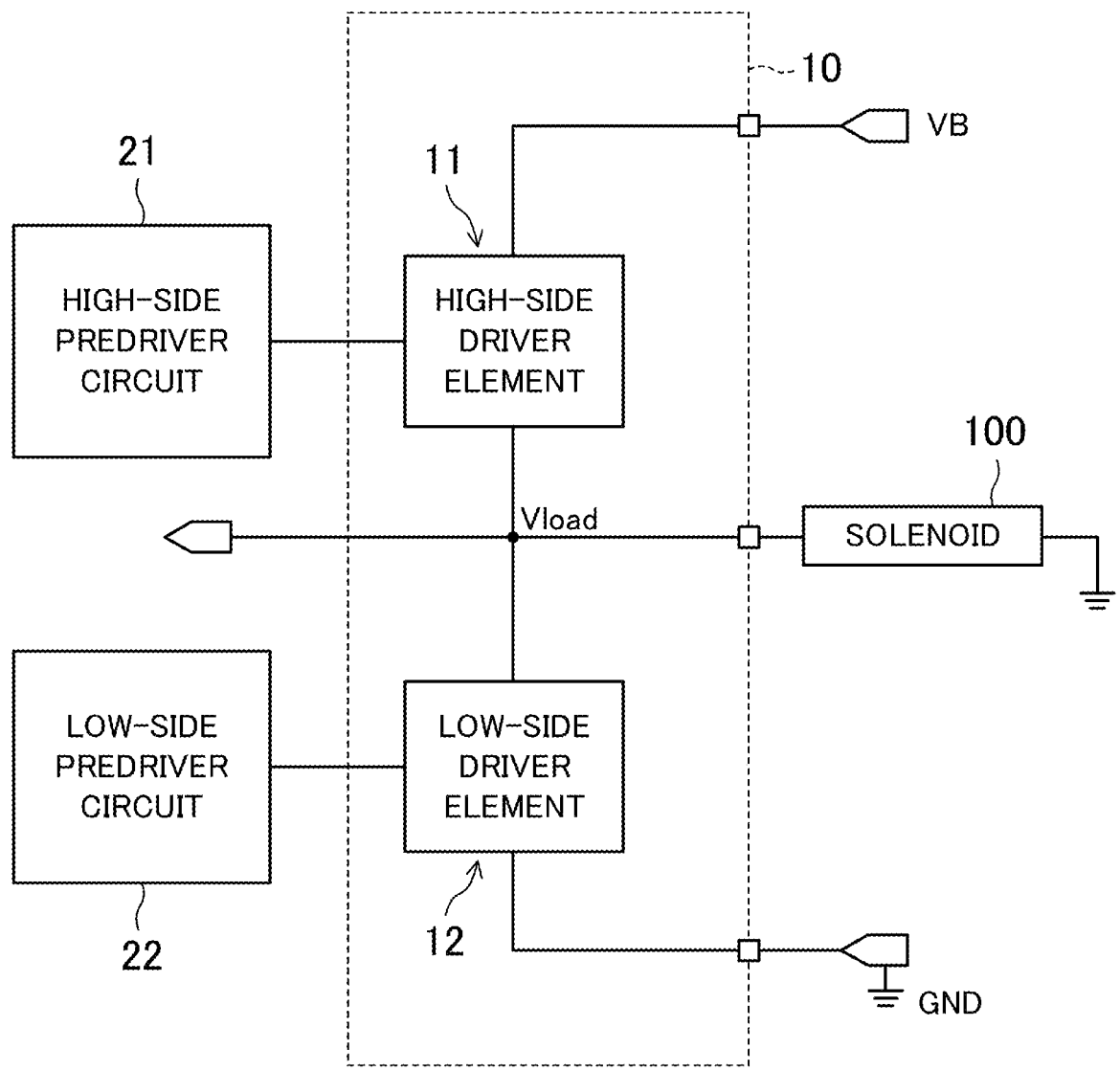
FIG. 2 illustrates a configuration of a driver circuit.

As illustrated in FIG. 2, the driver circuit 10 is configured as a half bridge circuit. The driver circuit 10 includes two driver elements. The two driver elements include a high-side driver element 11 connected to the high-voltage side and a low-side driver element 12 connected to the ground side. The high-side and low-side driver elements 11, 12 are each configured as a MOS transistor. In the following description, an N-type MOS transistor is employed as each of the high-side and low-side driver elements 11, 12. The high-side driver element 11 may be a P-type MOS transistor. The low-side driver element 12 may not be a MOS transistor, but be a diode.

Alternately turning ON/OFF the high-side driver element 11 and the low-side driver element 12 so that their ON periods do not overlap allows alternate supply of current from the high side to the low side of the solenoid valve 100, thereby controlling operation of the solenoid valve 100.

The predriver circuit 20 includes a high-side predriver circuit 21 and a low-side predriver circuit 22. The high-side predriver circuit 21 is connected to a gate of the high-side driver element 11 to control operation of the high-side driver element 11. The low-side predriver circuit 22 is connected to a gate of the low-side driver element 12 to control operation of the low-side driver element 12. Although will be described later in detail, at least one of the high-side predriver circuit 21 or the low-side predriver circuit 22 has a configuration for reducing electro magnetic interference (EMI) noise and switching loss which occur when the driver element 11, 12 is turned ON/OFF. In the following description, the high-side predriver circuit 21 has the aforementioned configuration.

Figure 3:
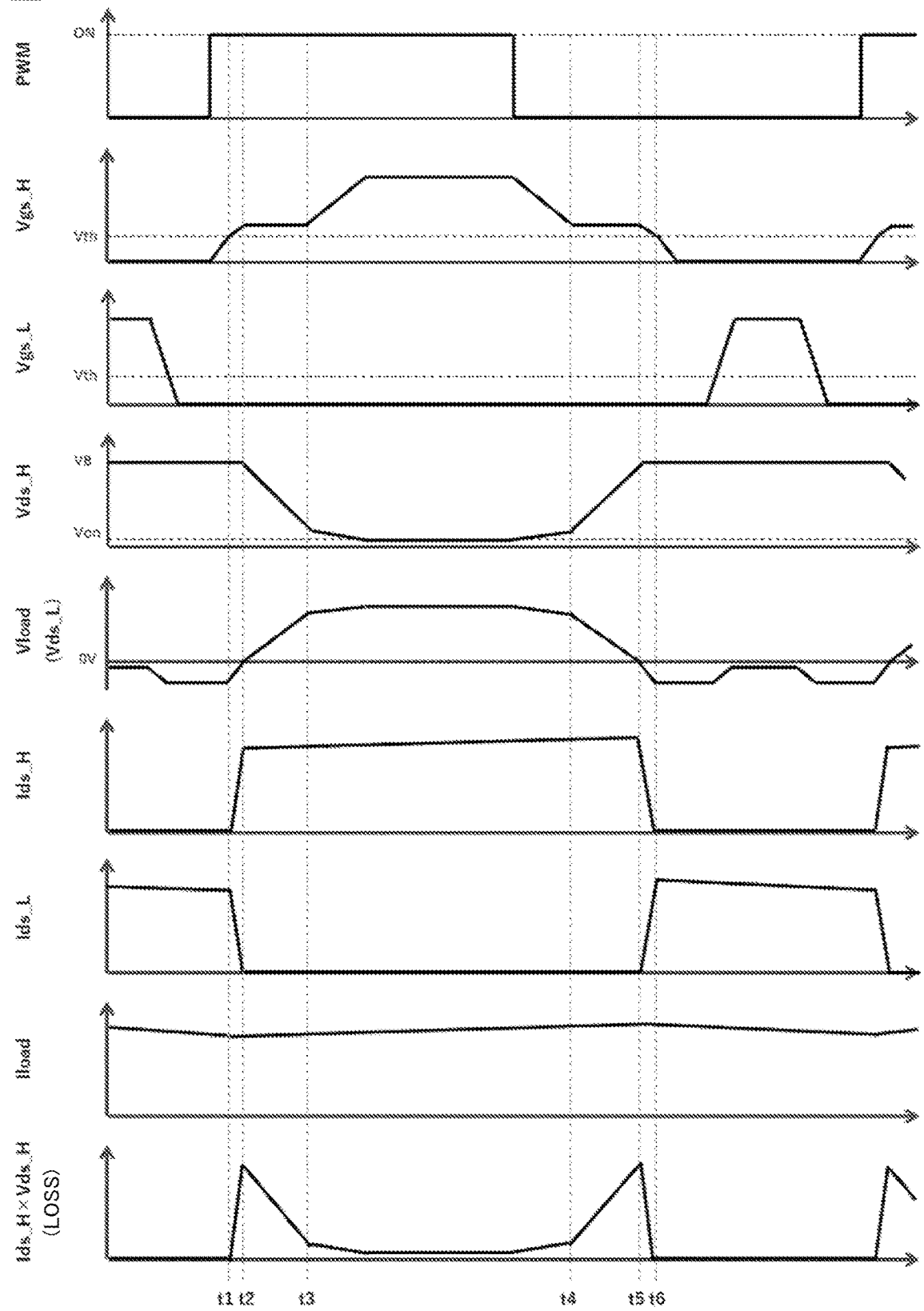
FIG. 3 is a timing chart when a high-side transistor is turned ON/OFF.

FIG. 3 is a timing chart in a steady state when the high-side driver element 11 or the low-side driver element 12 is turned ON/OFF in the circuit configuration shown in FIG. 2. The timing chart shows an operation example where an N-type MOS transistor is employed as each of the high-side and low-side driver elements 11, 12 as mentioned above.

When an ON signal of the high-side driver element 11 is output with the low-side driver element 12 OFF, i.e., the gate-to-source voltage (Vgs_L) lower than a threshold voltage (Vth), current is applied to the gate of the high-side driver element 11 via the high-side predriver circuit 21. The application of current to the gate of the high-side driver element 11 charges the gate, which increases the gate-to-source voltage (Vgs_H) of the high-side driver element 11. At this time, until the voltage reaches the threshold voltage (Vth) of the MOS transistor, current flows from the ground (GND) to the solenoid valve 100 via the body diode of the low-side driver element so as to maintain the current flowing in the solenoid. Due to this current, the high-side driver element 11, the low-side driver element 12, and the solenoid valve 100 are electrically connected to each other, and the output voltage (Vload) falls below 0. The drain-to-source voltage (Vds_H) is a difference between a power supply voltage (VB) and an output voltage.

When the gate-to-source voltage of the high-side driver element 11 exceeds the threshold voltage (Vth) at a time point t1, the high-side driver element 11 is turned ON, and current (Ids_H) starts to flow between the drain and the source of the high-side driver element 11. This causes current to flow in the solenoid valve 100 via a transistor of the high-side driver element 11. The drain-to-source current steeply rises and further increases until reaching the load current value (Iload) flowing in the solenoid valve 100.

When the drain-to-source current of the high-side driver element 11 reaches the load current value flowing in the solenoid valve 100 at a time point t2, the gate-to-source voltage of the high-side driver element 11 rises again through a mirror period (period between the time point t2 and a time point t3).

When the current flowing between the drain and the source of the high-side driver element 11 reaches the load current value, the drain-to-source voltage of the high-side driver element 11 decreases. The source-side potential is lower than the drain-side potential by the ON-state voltage (Von) of the high-side driver element 11. Thus, the drain-to-source voltage decreases to the ON-state voltage. The ON-state voltage is expressed as the product of the On resistance of the high-side driver element 11 and the drain-to-source current.

The output voltage rises by the current flowing between the drain and the source of the high-side driver element 11. The output voltage steeply rises during the mirror period, and then reaches VB-Von. This voltage causes current to flow in the solenoid valve 100, thereby driving the solenoid valve 100.

When a signal to turn the high-side driver element 11 OFF is input, the gate is discharged, thereby decreasing the gate-to-source voltage of the high-side driver element 11. With the decrease, the drain-to-source voltage of the high-side driver element 11 slightly rises, and the output voltage slightly decreases. The gate-to-source voltage further decreases after the mirror period (the period between the time point t4 and the time point t5). During the mirror period, the drain-to-source voltage rises and reaches the power supply voltage.

After the mirror period, the drain-to-source current of the high-side driver element 11 decreases. At this time, current is supplied to the solenoid valve 100 via the body diode of the low-side driver element 12 so that the load current flowing in the solenoid valve 100 is at constant. Accordingly, the output voltage falls below 0 again.

When the gate-to-source voltage of the high-side driver element 11 reaches the threshold voltage at a time point t6, the drain-to-source current of the high-side driver element 11 reaches 0. After that, the current is supplied to the solenoid valve 100 via the body diode of the low-side driver element 12 until the low-side driver element 12 is turned ON. After the low-side driver element 12 is turned ON, the current is supplied to the solenoid valve 100 via a transistor of the low-side driver element 12.

The electric power in the rising and falling periods in the waveforms of the drain-to-source currents of the high-side driver element and the low-side driver element, and the electric power in the rising and falling periods in the waveform of the output voltage are switching losses due to heat generation. Each switching loss is expressed as the product of each current value in the current slope, which indicates rising and falling of the current in the waveform of the current of each driver element 11, 12, and the drain-to-source voltage of each driver element 11, 12 during the period of the voltage slope, which indicates rising and falling of the voltage in the waveform of the output voltage. Specifically, changes in the switching loss of the high-side driver element 11 are shown in FIG. 3.

In order to reduce the switching loss, the current slope and the voltage slope can be made as steep as possible to shorten the duration of each slope. However, the steep current slope causes a large noise due to an induced electromotive force generated by a parasitic inductance, and the steep voltage slope causes a large electro magnetic interference (EMI) noise due to high frequency components of the output voltage of the driver element. Therefore, the current slope and the voltage slope need to be controlled so as to achieve both the reduction in the noise and the reduction in the switching loss.

For the driver IC1 that drives the solenoid valve 100 mounted in the vehicle as in the present embodiment, the arrangement of the wire harness connected from the battery to the driver circuit 10 (in particular, the high-side transistor) varies depending on the configuration of the body of the vehicle and the like. When the arrangement of the wire harness varies, the length of the wire harness changes, thereby changing the noise due to the influence of the parasitic inductance. Thus, the potential of the drain of the high-side driver element 11 varies, thereby changing the waveform of the output voltage output to the solenoid valve 100. Further, when the arrangement of the driver IC varies depending on the configuration of the body of the vehicle or the like, the heat dissipation structure of heat generated by switching or the like varies, thereby changing the amount of heat generation allowed by the driver circuit. Therefore, in order to achieve both the reduction in the EMI noise and the reduction in the switching loss, the current slope and the voltage slope need to be matched to be suitable depending on the kind of the vehicle, further on the arrangement of the driver IC1 in each vehicle.

However, the matching the current slope and the voltage slope depending on the kind of the vehicle and the arrangement brings about a need to change specifications of the driver IC depending on each condition. This may result in deterioration of productivity. For this reason, increasing the commonality of the driver IC as much as possible is in demand to improve productivity.

Hence, in the present embodiment, the configuration of the predriver circuit 20, especially the high-side predriver circuit 21, is devised to make a slope of current (Ids_H) flowing between the drain and the source of the high-side driver element 11 and a slope of the output voltage (Vload) be suitable depending on conditions while the commonality of the driver IC1 is increased.

Figure 4:
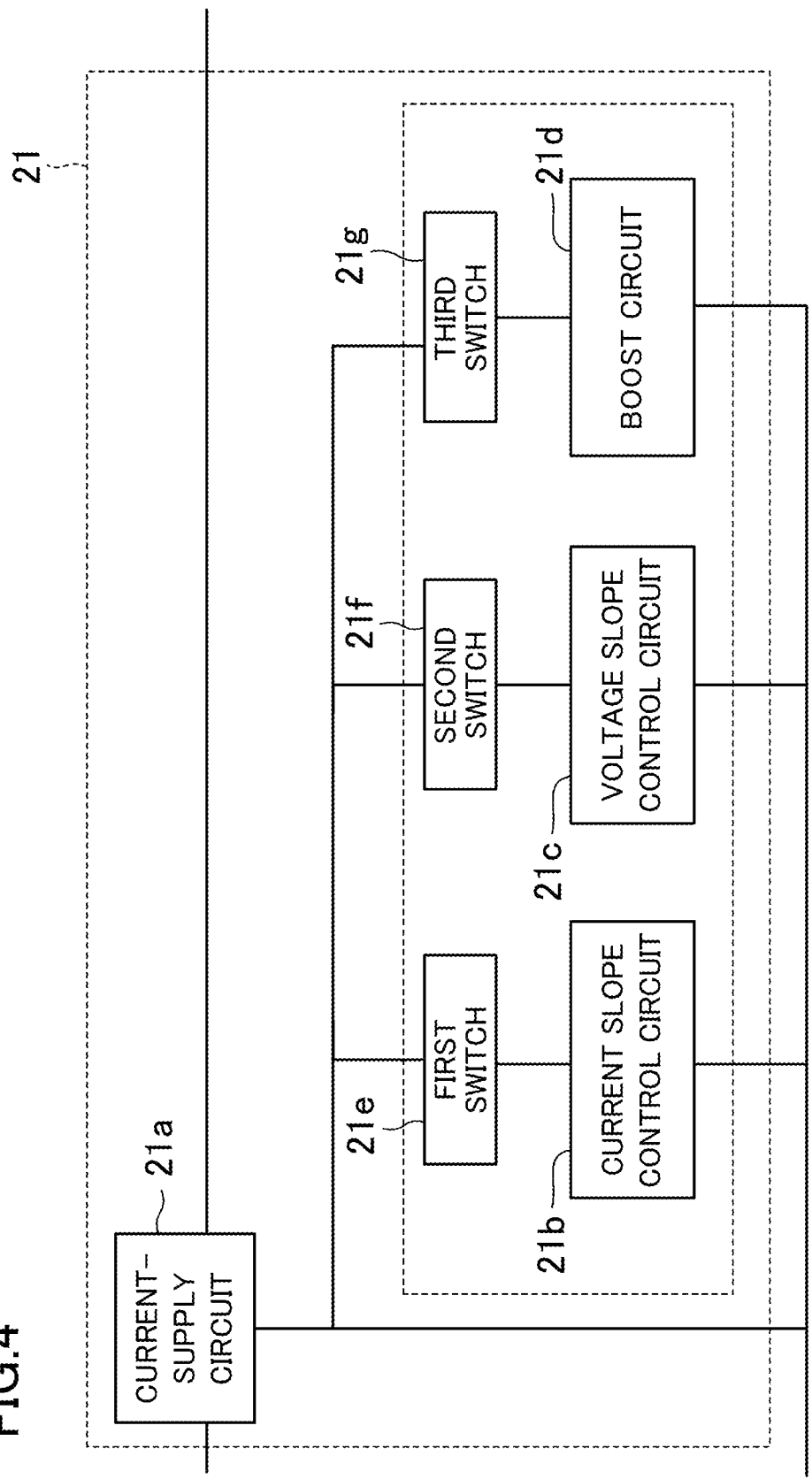
FIG. 4 is a block diagram schematically illustrating the configuration of a high-side predriver circuit.

FIG. 4 illustrates the configuration of the high-side predriver circuit 21. The high-side predriver circuit 21 includes: a current-supply circuit 21a configured to supply current to the gate of the high-side driver element 11; a current slope control circuit 21b configured to control a slope of current flowing between the drain and the source of the high-side driver element 11; and a voltage slope control circuit 21c configured to control a slope of the output voltage. The high-side predriver circuit 21 further includes a boost circuit 21d configured to supply larger current to the gate of the high-side driver element 11. A first switch 21e is provided between the current-supply circuit 21a and the current slope control circuit 21b. A second switch 21f is provided between the current-supply circuit 21a and the voltage slope control circuit 21c. A third switch 21g is provided between the current-supply circuit 21a and the boost circuit 21d. The current-supply circuit 21a, current slope control circuit 21b, voltage slope control circuit 21c, and boost circuit 21d, and the first switch 21e, second switch 21f, and third switch 21g are each connected to the controller 30 so that the controller 30 input control signals thereto. The configuration of FIG. 4 merely shows some elements in the configuration of the high-side predriver circuit 21 as examples, and does not exclude other elements of the high-side predriver circuit 21.

In the present embodiment, the current supplied to the gate of the high-side driver element 11 is controlled to adjust the charging rate and the discharging rate of the gate, thereby controlling the slope of the current flowing between the drain and the source of the high-side driver element 11 and the slope of the output voltage. The current slope control circuit 21b and the voltage slope control circuit 21c are each made of a plurality of current mirror circuits, and are configured to control the current supplied to the gate of the high-side driver element 11 in accordance with the number of transistors arranged in parallel in the current mirror circuits operated, for example.

For example, the current-supply circuit 21a is made of a plurality of current mirror circuits, and is configured to input/output current generated in the current slope control circuit 21b, voltage slope control circuit 21c, and boost circuit 21d to/from the gate of the high-side driver element 11. In other words, the current-supply circuit 21a is configured to both charge and discharge the gate of the high-side driver element 11.

When the first switch 21e is turned ON, the current slope control circuit 21b is connected to the current-supply circuit 21a to supply, to the high-side driver element 11, control current for controlling the slope of the current flowing between the drain and the source of the high-side driver element 11. When the second switch 21f is turned ON, the voltage slope control circuit 21c is connected to the current-supply circuit 21a to supply, to the high-side driver element 11, control current for controlling the slope of the output voltage.

The amount of current adjusted by the current slope control circuit 21b and the voltage slope control circuit 21c, i.e., the number of current mirror circuits operated among the plurality of current mirror circuits constituting the current slope control circuit 21b and the voltage slope control circuit 21c, is determined by the control signal input from the controller 30 to the high-side predriver circuit 21. The control signal includes a plurality of current control signals set for each pattern of the current slope, and a plurality of voltage control signals set for each pattern of the voltage slope. The current control signals and the voltage control signals are each a signal indicating the number of current mirror circuits operated in the current slope control circuit 21b and the voltage slope control circuit 21c. The current control signals and the voltage control signals are each an example of the set signal input from outside to the controller 30.

In the first embodiment, the controller 30 inputs a current control signal input from the outside to the current slope control circuit 21b, and a voltage control signal input from the outside to the voltage slope control circuit 21c.

In the present embodiment, the timing when the first switch 21e is turned ON and the timing when the second switch 21f is turned ON are shifted from each other in order to adjust the current slope and the voltage slope.

The configuration of the high-side predriver circuit 21 described herein can be employed as the configuration of the low-side predriver circuit 22 to be used for control of the low-side driver element 12.

FIG. 5 shows drive timings for the current slope control circuit 21b, voltage slope control circuit 21c, and boost circuit 21d in rising of the current (Ids_H) flowing between the drain and the source of the high-side driver element 11 and the output voltage (Vload). In FIG. 5, the time points t1 to t6 correspond to the respective time points t1 to t6 of FIG. 3.

Input of a signal for turning ON the high-side driver element 11 with the low-side driver element 12 OFF turns the current-supply circuit 21a in a mode of charging the gate of the high-side driver element 11. At this time, the third switch 21g is turned ON to connect the boost circuit 21d to the current-supply circuit 21a, thereby supplying relatively large current to the gate of the high-side driver element 11. This charges the gate in the shortest possible time and brings the gate-to-source voltage up to a threshold voltage as quickly as possible.

When the gate-to-source voltage reaches the threshold voltage at the time point t1, the third switch 21g is turned OFF, and the first switch 21e is turned ON. The current adjusted in the current slope control circuit 21b is thus supplied to the gate of the high-side driver element 11. Increasing or decreasing the current adjusted in the current slope control circuit 21b adjusts inclination of the slope of the current flowing in the high-side driver element 11. Specifically, the higher the amount of current supplied to the gate is, the faster the charging of the gate is; therefore, the steeper the inclination of the slope of rising current between the gate and the drain is. On the other hand, the lower the amount of current supplied to the gate is, the slower the charging of the gate is; therefore, the gentler the inclination of the current slope is.

At the time point t2, the drain-to-source current (Ids_H) of the high-side driver element 11 reaches the load current value flowing in the solenoid valve 100, and when the mirror period starts, the first switch 21e is turned OFF, and the second switch 21f is turned ON. The current adjusted in the voltage slope control circuit 21c is thus supplied to the gate of the high-side driver element 11. Increasing or decreasing the current adjusted in the voltage slope control circuit 21c adjusts inclination of the voltage slope. Specifically, the higher the amount of current supplied to the gate is, the faster the charging of the gate is; therefore, the steeper the inclination of the rising voltage slope is. On the other hand, the lower the amount of current supplied to the gate is, the slower the charging of the gate is; therefore, the gentler the inclination of the current slope is. At this time, the current (Ids_H) flowing in the high-side driver element 11 reaches a load current value (Iload) flowing in the solenoid in steady operation. The slope of the output voltage thus can be adjusted separately.

When the mirror period is ended at the time point t3, the second switch 21f is turned OFF, and the third switch 21g is turned ON. The current adjusted in the boost circuit 21d is thus supplied to the gate of the high-side driver element 11. This can maintain the high gate voltage to maintain the ON state of the high-side driver element 11.

On the other hand, when the high-side driver element 11 is turned OFF, the current-supply circuit 21a is switched to discharge the gate of the high-side driver element 11. As a result, current flows in the discharge direction and the output voltage starts to decrease. At this time, turning ON the third switch 21g allows a reduction in the switching loss. When the gate-to-source voltage enters the mirror period (the period from the time point t4 to the time point t5), the third switch 21g is turned OFF, and the second switch 21f is turned ON. This can adjust the inclination of the rising voltage slope. After the mirror period is ended, the second switch 21f is turned OFF, and the first switch 21e is turned ON. This can adjust the inclination of the slope of falling current flowing in the high-side driver element 11. When the output current reaches 0, the first switch 21e is turned OFF. In order to reliably end the discharging of the gate, the third switch 21g may be turned ON again after the first switch 21e is turned OFF.

As can be seen from above, setting the current slope control period in which the slope of current flowing through the high-side driver element 11 is controlled and the voltage slope control period in which the voltage slope is controlled not to overlap with each other allows adjustment of both the current slope and the voltage slope. Accordingly, the reduction in the EMI noise and the reduction in the switching loss both can be achieved.

Figure 6A:
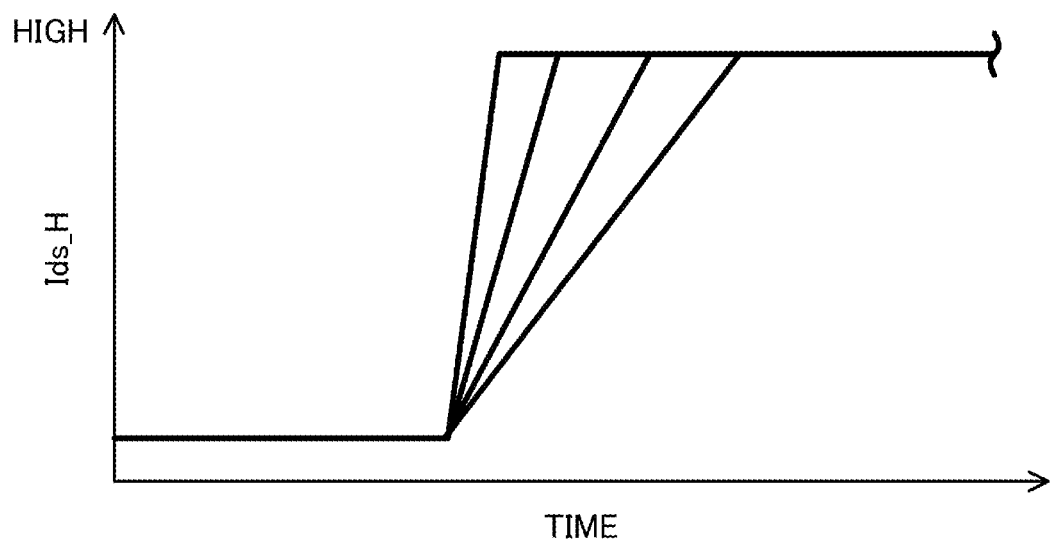
FIGS. 6A and 6B are graphs showing results of adjustment of inclination of the current slope in rising and the voltage slope in rising.
Figure 6B:
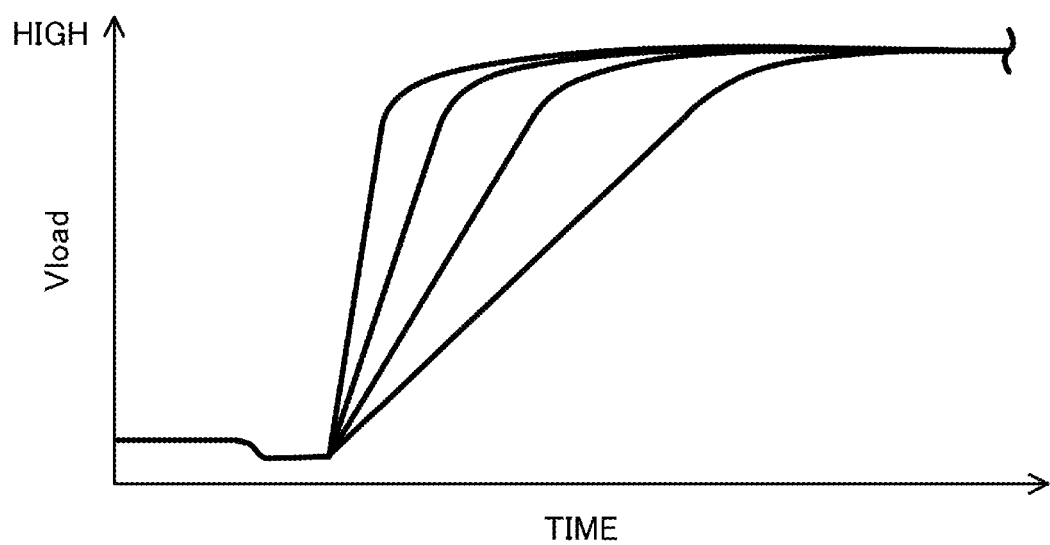
Figure 7:
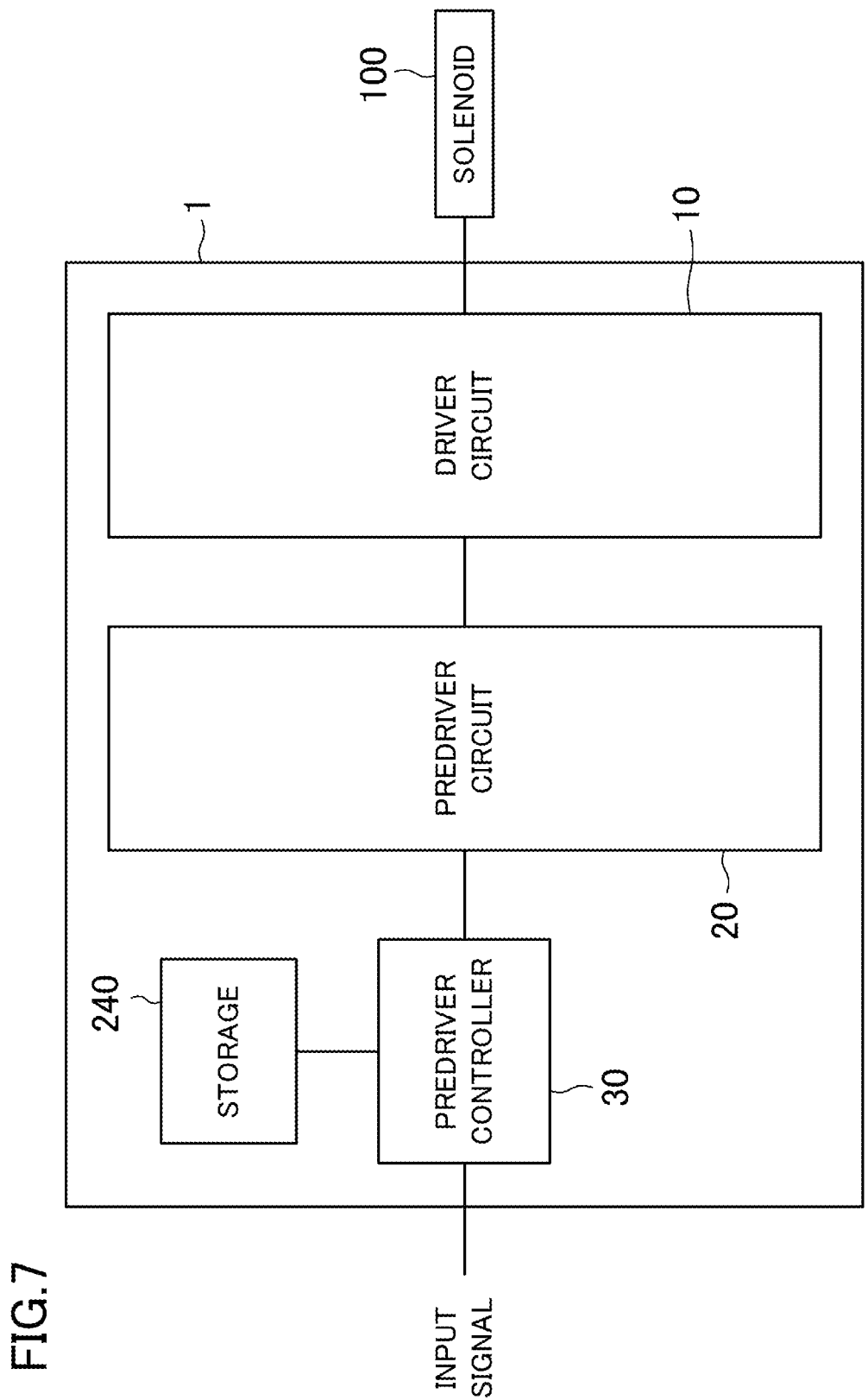
FIG. 7 is a block diagram schematically illustrating IC constituting a load drive control device according to a second embodiment.

FIGS. 6A and 6B show results of the simulation for the case where the slope of current flowing through the driver element and the slope of the output voltage are controlled as mentioned above, assuming the circuits of the present embodiment. FIG. 6A shows the results of the slope of the current flowing through the driver element. FIG. 6B shows the results of the slope of the output voltage. In FIG. 6A, the horizontal axis is extended relative to the horizontal axis of the FIG. 6B for easy understanding of the change.

As can be seen from FIG. 6A, the change in the current supplied from the current slope control circuit 21b to the gate allows a change in the inclination of the slope of the current flowing through the driver element. Although four patterns of the current slope are used herein, five or more patterns can be formed by adjusting the number of current mirror circuits constituting the current slope control circuit 21b, for example. Although not shown in FIG. 6A, also in the case of discharging the gate of the driver element, the change in current drawn from the gate allows a change in the inclination of the falling current slope.

As can be seen from FIG. 6B, the change in the current supplied from the voltage slope control circuit 21c to the gate allows a change in the inclination of the slope of the output voltage. Although four patterns of the voltage slope are used herein as in the case of the current slope shown in FIG. 6A, five or more patterns can be formed by adjusting the number of current mirror circuits constituting the current slope control circuit 21b, for example. Although not shown in FIG. 6B, also in the case of discharging the gate of the driver element, the change in current drawn from the gate allows a change in the inclination of the falling voltage slope.

As can be seen from above, the slope of current (Ids_H) flowing through the high-side driver element and the slope of the output voltage (Vload) can be controlled separately. Thus, a suitable pattern of the current slope and a suitable pattern of the voltage slope can be selected according to the arrangement of the wire harness connected to the driver circuit 10, for example. For example, if the wire harness needs to be long, a gentle current slope may be selected, and if the wire harness is arranged at a position where heat dissipation is difficult, such as near the engine, a steep current slope and a steep voltage slope may be selected within the acceptable range of EMI noise. At this time, signals for selecting the current slope and the voltage slope are input from outside. Thus, a suitable current slope and a suitable voltage slope can be achieved according to the configuration of the vehicle and the arrangement of the driver IC1 while the configuration of the driver IC1 is kept the same.

Therefore, in the first embodiment, the driver IC1 as a load drive control device includes a driver circuit 10 including a high-side driver element 11 which drives a load (solenoid valve 100), a high-side predriver circuit 21 which drives the high-side driver element 11, and a controller 30 which outputs a control signal to the high-side predriver circuit 21, to control the driving state of the high-side driver element 11. The high-side predriver circuit 21 includes slope control circuits (a current slope control circuit 21b and a voltage slope control circuit 21c) which separately perform control of the inclinations of the slopes of rising current and falling current flowing through the high-side driver element 11, and control of inclinations of the slopes of rising output voltage and falling output voltage output from the driver circuit 10. The controller 30 outputs, to the high-side predriver circuit 21, a current control signal selected from a plurality of current control signals set for each pattern of the current slope, and a voltage control signal selected from a plurality of voltage control signals set for each pattern of the voltage slope, to control the slope of the current from the high-side driver element 11 and the slope of the voltage from the driver circuit 10. As described above, the controller 30 may input a signal for a suitable pattern selected from patterns of each slope to the high-side predriver circuit 21 according to the peripheral status of the equipment mounted in the driver IC1. In this manner, the reduction in EMI noise and the reduction in switching loss for each equipment can be achieved while achieving the commonality of the configuration of the driver IC.

Further, in the first embodiment, the controller 30 sets, for each period of the current slope and the voltage slope, a current slope control period in which the slope of current flowing through the high-side driver element 11 is controlled and a voltage slope control period in which the voltage slope is controlled such that the periods do not overlap with each other, and the controller 30 further outputs a control signal for controlling the current slope in the current slope control period to the current slope control circuit 21b, and outputs a control signal for controlling the voltage slope in the voltage slope control period to the voltage slope control circuit 21c. That is, the period of rising of the output current is shifted from the period of rising of the output voltage, and the period of falling of the output current is shifted from the period of falling of the output voltage. Thus, the current slope control period and the voltage slope control period can be set not to overlap with each other. This allows separate control of the current slope and the voltage slope. Accordingly, the reduction in the EMI noise and the reduction in the switching loss can be effectively achieved.

In the first embodiment, if the high-side driver element 11 is a MOS transistor, the current slope control period is set for a period from when the high-side driver element 11 is turned ON until the current flowing through the high-side driver element 11 reaches load current when the high-side driver element 11 is turned ON, and the current slope control period is set for a period after the voltage slope control period until the high-side driver element 11 is turned OFF when the high-side driver element 11 is turned OFF, and the voltage slope control period is set for a period including a mirror period in turning ON and OFF of the high-side driver element 11. This allows control of the voltage slope for as long as possible while suitably controlling the slope of current flowing through the high-side driver element 11. Specifically, setting the period of adjusting the voltage slope for a period including the mirror period allows control of the voltage slope with almost no influence on the output current. As a result, the reduction in the EMI noise and the reduction in the switching loss can be effectively achieved.

Second Embodiment

A second embodiment will now be described in detail with reference to the drawings. In the following description, components that are common with those described in the first embodiment will be denoted by the same reference numerals, and will not be described in detail.

The second embodiment differs from the first embodiment in that a storage 240 is mounted in a driver IC 201. The storage 240 stores, in advance, a plurality of current control signals set for each pattern of the current slope and a plurality of voltage control signals set for each pattern of the voltage slope. More specifically, the storage 240 stores, in advance, combinations of the plurality of current control signals and the plurality of voltage control signals in a table format.

In the second embodiment, the controller 30 reads a signal corresponding to a combination of a current control signal and a voltage control signal from the storage 240, and inputs the current control signal corresponding to the read signal to the current slope control circuit 21b and inputs the voltage control signal corresponding to the read signal to the voltage slope control circuit 21c.

As described above, in the second embodiment, the driver IC 201 includes a storage 240 storing, in advance, a plurality of current control signals set for each pattern of the current slope and a plurality of voltage control signals set for each pattern of the voltage slope. This configuration allows the control to be completed within the driver IC 201 alone and allows accurate control of the current slope and the voltage slope.

Specifically, in the present embodiment, the storage 240 stores, in advance, combinations of the plurality of current control signals and the plurality of voltage control signals, and the controller 30 reads a combination of a current control signal and a voltage control signal from the storage 240 and outputs control signals for the current control signal and the voltage control signal to the high-side predriver circuit 21. The controller 30 only needs to select a combination of a current control signal and a voltage control signal. This allows the control of the driver circuit 10 to be simplified. The controller 30 may change the combination of the current control signal and the voltage control signal read from the storage 240 and output the control signals to the predriver circuit. This allows a suitable current waveform and a suitable voltage waveform to be matched with each other after arrangement of the driver IC in equipment of a vehicle or the like, and the reduction in the EMI noise and the reduction in the switching loss can be effectively achieved.

Other Embodiments

The present disclosure is not limited to the embodiments described above, and may be modified within the scope of the claims.

For example, in the first and second embodiments, the periods of charging and discharging the gate are adjusted by the adjustment of the current supplied to the gate of the high-side driver element 11, thereby controlling the slope of current flowing between the drain and the source of the high-side driver element 11 and the slope of the output voltage. The present disclosure is not limited thereto. The voltage supplied to the gate of the high-side driver element 11 may be adjusted to control the current slope and the voltage slope.

In the first and second embodiments, the periods of charging and discharging the gate are adjusted by the adjustment of the current supplied to the gate of the high-side driver element 11, thereby controlling the slope of current flowing between the drain and the source of the high-side driver element 11 and the slope of the output voltage. The present disclosure is not limited thereto. The current supplied to the gate of the low-side driver element 12 may be adjusted to control the current slope and the voltage slope. In this case, the low-side predriver circuit 22 needs to have a configuration shown in FIG. 4.

In the first and second embodiments, the solenoid valve 100, which is a load, is grounded. The present disclosure is not limited thereto. The solenoid valve 100 may be connected to a power source.

In the first embodiment, the second switch 21f is turned OFF except when controlling the voltage slope. The present disclosure is not limited thereto. the second switch 21f may be turned ON when the third switch 21g is turned ON, i.e., when the boost circuit 21d is used. This allows the gate to be charged and discharged as quickly as possible, to the extent that the influence on the control of the voltage slope is small.

The embodiments described above are merely examples in nature, and the scope of present disclosure should not be interpreted in a limited manner. The scope of the present disclosure is defined by the appended claims, and all variations and changes belonging to a range equivalent to the range of the claims are within the scope of the present disclosure.

What is claimed is:
1. A load drive control device comprising:
   a driver circuit configured to drive a load;
   a predriver circuit configured to drive the driver circuit; and
   a controller configured to output a control signal to the predriver circuit to control a driving state of the driver circuit, the driver circuit including a high-side driver element and a low-side driver element, the predriver circuit including a slope control circuit configured to separately control inclination of a current slope indicating rising and falling of an output current output from at least either one of the high-side driver element or the low-side driver element, and inclination of a voltage slope indicating rising and falling of an output voltage output from the driver circuit, the controller being configured to output, to the predriver circuit, a current control signal selected from a plurality of current control signals set for each pattern of the current slope, and a voltage control signal selected from a plurality of voltage control signals set for each pattern of the voltage slope, to control the current slope and the voltage slope;

wherein the controller is configured to control a current slope control period in which the current slope is controlled, and a voltage slope control period in which the voltage slope is controlled for each period of the current slope and the voltage slope so as not to overlap with each other, and wherein further output a control signal for controlling the current slope during the current slope control period to the slope control circuit, and output a control signal for controlling the voltage slope during the voltage slope control period to the slope control circuit.

2. The load drive control device of claim 1, wherein the predriver circuit comprises:

a high-side predriver circuit configured to drive the high-side driver element; and a low-side predriver circuit configured to drive the low-side driver element, and the slope control circuit is provided in the high-side predriver circuit, and is configured to separately control inclination of the current slope indicating rising and falling of the output current output from the high-side driver element, and inclination of the voltage slope indicating rising and falling of the output voltage output from the driver circuit.

3. The load drive control device of claim 2, further comprising a storage electrically connected to the controller and storing the plurality of current control signals and the plurality of voltage control signals, wherein the controller is configured to read and output a desired current control signal and a desired voltage control signal from the plurality of current control signals and the plurality of voltage control signals stored in the storage to the predriver circuit.

4. The load drive control device of claim 3, wherein the storage stores combinations of the plurality of current control signals and the plurality of voltage control signals in advance, and the controller is configured to read and output a combination of the desired current control signal and the desired voltage control signal from the storage to the predriver circuit.

5. The load drive control device of claim 4, wherein the controller is configured to output a control signal to the predriver circuit so that the voltage slope control period is set to be after the current slope control period when the high-side driver element or the low-side driver element is turned ON, and the current slope control period is set to be after the voltage slope control period when the high-side driver element or the low-side driver element is turned OFF.

6. The load drive control device of claim 5, wherein the high-side driver element and the low-side driver element are transistors, the controller is configured to set, as the current slope control period, a period from when the high-side driver element or the low-side driver element is turned ON until current output from the high-side driver element and the low-side driver element reaches load current if the high-side driver element or the low-side driver element is turned ON, and a period after the voltage slope control period and until the high-side driver element or the low-side driver element is turned OFF if the high-side driver element or the low-side driver element is turned OFF, and set, as the voltage slope control period, a period including a mirror period in turning ON and OFF of the high-side driver element and the low-side driver element.

7. The load drive control device of claim 1, further comprising a storage electrically connected to the controller and storing the plurality of current control signals and the plurality of voltage control signals, wherein the controller is configured to read and output a desired current control signal and a desired voltage control signal from the plurality of current control signals and the plurality of voltage control signals stored in the storage to the predriver circuit.

8. The load drive control device of claim 7, wherein the storage may store combinations of the plurality of current control signals and the plurality of voltage control signals in advance, and the controller is configured to read and output a combination of the desired current control signal and the desired voltage control signal from the storage to the predriver circuit.

9. The load drive control device of claim 8, wherein the controller is configured to output a control signal to the predriver circuit so that the voltage slope control period is set to be after the current slope control period when the high-side driver element or the low-side driver element is turned ON, and the current slope control period is set to be after the voltage slope control period when the high-side driver element or the low-side driver element is turned OFF.

10. The load drive control device of claim 9, wherein the high-side driver element and the low-side driver element are transistors, the controller is configured to set, as the current slope control period, a period from when the high-side driver element or the low-side driver element is turned ON until current output from the high-side driver element and the low-side driver element reaches load current if the high-side driver element or the low-side driver element is turned ON, and a period after the voltage slope control period and until the high-side driver element or the low-side driver element is turned OFF if the high-side driver element or the low-side driver element is turned OFF, and set, as the voltage slope control period, a period including a mirror period in turning ON and OFF of the high-side driver element and the low-side driver element.

11. The load drive control device of claim 1, wherein the controller is configured to output a control signal to the predriver circuit so that the voltage slope control period is set to be after the current slope control period when the high-side driver element or the low-side driver element is turned ON, and the current slope control period is set to be after the voltage slope control period when the high-side driver element or the low-side driver element is turned OFF.

12. The load drive control device of claim 11, wherein
the high-side driver element and the low-side driver element are transistors,
the controller is configured to set, as the current slope control period, a period from when the high-side driver element or the low-side driver element is turned ON until current output from the high-side driver element and the low-side driver element reaches load current if the high-side driver element or the low-side driver element is turned ON, and a period after the voltage slope control period and until the high-side driver element or the low-side driver element is turned OFF if the high-side driver element or the low-side driver element is turned OFF, and
set, as the voltage slope control period, a period including a mirror period in turning ON and OFF of the high-side driver element and the low-side driver element.

* * * * *